United States Patent [19]
Makabe et al.

[11] Patent Number: 4,498,063
[45] Date of Patent: Feb. 5, 1985

[54] SWITCHED CAPACITOR FILTER HAVING A REDUCED CAPACITANCE

[75] Inventors: Takayoshi Makabe; Yoshiaki Kuraishi; Kenji Nakayama; Tadakatsu Kimura, all of Tokyo, Japan

[73] Assignees: Nippon Electric Co., Ltd.; Nippon Telegraph & Telephone Public Corporation, both of Tokyo, Japan

[21] Appl. No.: 458,748

[22] Filed: Jan. 17, 1983

[30] Foreign Application Priority Data

Jan. 21, 1982 [JP] Japan ..................................... 57-8202

[51] Int. Cl.³ ..................... H03H 19/00; H03H 11/12
[52] U.S. Cl. .................................... 333/173; 328/151; 333/172
[58] Field of Search ....................... 333/167, 172, 173; 328/151, 167; 307/352, 353

[56] References Cited

U.S. PATENT DOCUMENTS 4,344,050 8/1982 Callahan ............................. 333/173

OTHER PUBLICATIONS

Fleischer et al.-"A Family of Active Switched Capacitor Biquad Building Blocks", The Bell System Technical Journal, vol. 58, No. 10, Dec. 1979, pp. 2235-2239.

Primary Examiner—Marvin L. Nussbaum
Attorney, Agent, or Firm—Laff, Whitesel, Conte & Saret

[57] ABSTRACT

In a switched capacitor filter of a first-order responsive to a filter input signal for producing a filter output signal by carrying out sampling operation at a predetermined sampling rate by the use of switching circuit, a capacitor, and an integrating circuit, a voltage divider produces a voltage divided signal in response to the filter input signal to reduce a total capacitance determined by capacitances of the capacitor and the integrating circuit. The voltage divided signal is sampled by the switching circuit to be sent to the integrating circuit at the sampling rate through the capacitor. The integrating circuit produces the filter output signal as a result of integration. In addition, an additional switched capacitor filter of a first-order is connected in cascade to the filter to form a switched capacitor filter of a second-order. The additional filter comprises an additional voltage divider for voltage dividing an output signal of the additional filter to deliver an additional voltage divided signal to the filter and the additional filter.

5 Claims, 8 Drawing Figures

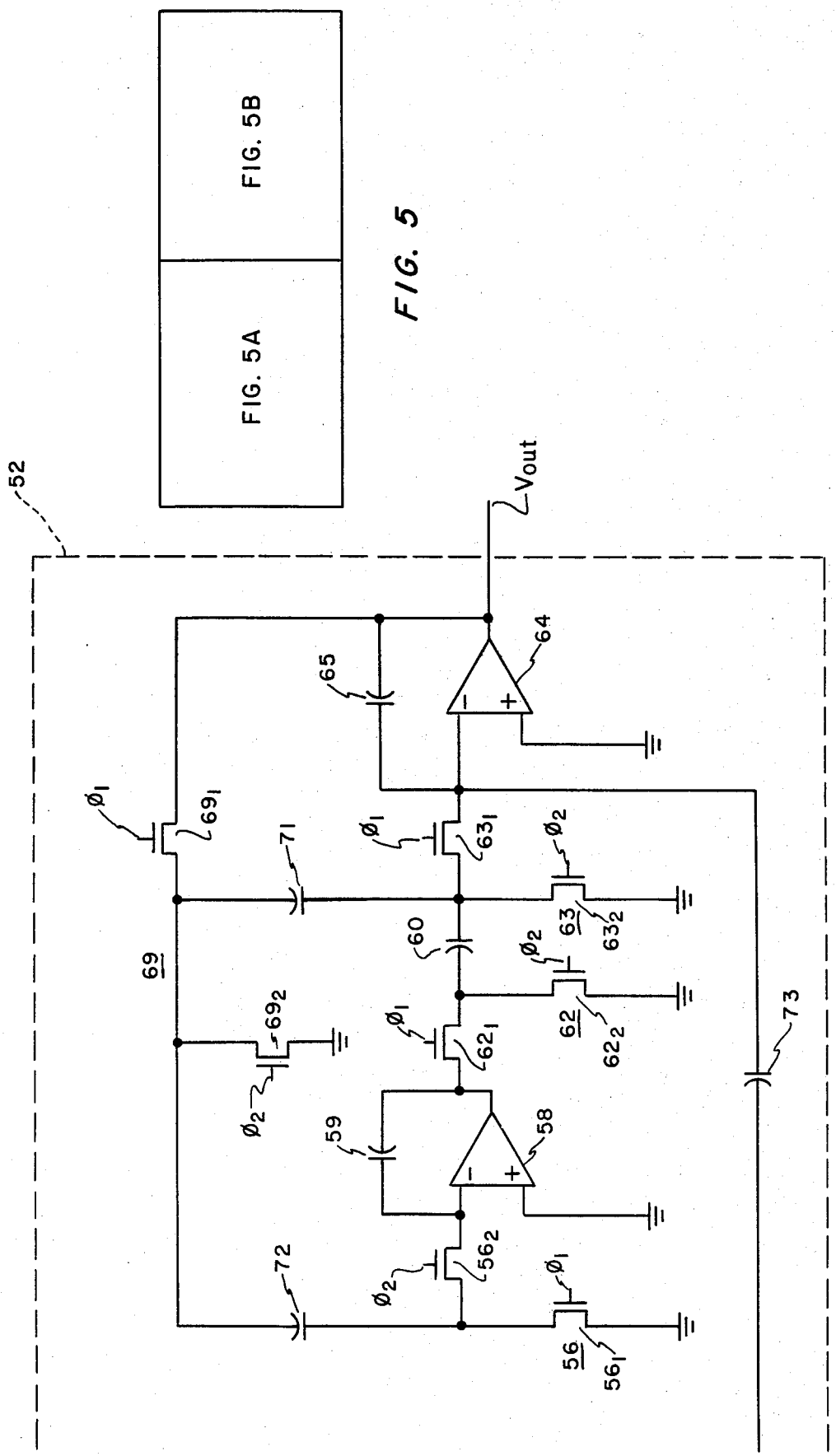

SWITCHED CAPACITOR FILTER HAVING A REDUCED CAPACITANCE

BACKGROUND OF THE INVENTION

This invention relates to a switched capacitor filter for filtering a filter input signal to produce a filter output signal by carrying out sampling operation.

As will later be described with reference to one of several figures of the accompanying drawing, a conventional switched capacitor filter of the type described comprises a capacitor, a sampling circuit for sampling the filter input signal at a sampling rate to produce a switched signal at the sampling rate, and an integrating circuit for integrating the switched signal to produce a filter output signal. The integrating circuit has an operational amplifier and an integrating capacitor inserted in a feedback path of the operational amplifier. The switched capacitor filter is specified by a transfer function dependent on a capacitor ratio of the integrating capacitor relative to a unit or a minimum capacitor.

A switched capacitor filter of the type described is proposed in a technical paper, IEEE International Symposium on Circuits and Systems, April 1980, pp. 309–312, contributed by Titkwan Hui and David J. Allstot, under the title of "MOS SWITCHED CAPACITOR HIGHPASS/NOTCH LADDER FILTERS".

It is pointed out in the Hui et al paper that a very large capacitor ratio is required in such a switched capacitor filter when the sampling rate becomes high as compared with an audio baseband frequency, such as 50 Hz, 60 Hz, or the like. This means that a very wide area should be occupied by the integrating capacitor on large scale integration. In order to minimize the occupied area, the unit capacitance must be chosen as low as possible. As will later be described with reference to another figure of the accompanying drawing, the Hui et al paper teaches use of a capacitive divider so as to reduce the capacitor ratio.

However, such a capacitive divider inevitably accompanies a stray capacitance, as will later be discussed. Inasmuch as the stray capacitance adversely affects a filter characteristic, it is necessary to reduce the stray capacitance by augmenting the unit capacitance. In this respect, the integrating capacitor should have a large capacitance. A total capacitance inevitably becomes large. Therefore, an area occupied by the capacitors relatively becomes wide on the large scale integration of the switched capacitor filter. The semiconductor chip must have a large size.

In addition, electric power consumption is increased with the switched capacitor filter because the operational amplifier should drive a large capacitance.

SUMMARY OF THE INVENTION

It is an object of this invention to provide a switched capacitor filter which is capable of reducing a total capacitance.

It is another object of this invention of the type described to provide a switched capacitor filter which has a small size when the switched capacitor filter is manufactured by an integration technique.

It is another object of this invention to provide a switched capacitor filter of the type described, which results in a low electric power consumption.

A switched capacitor filter to which this invention is applicable is responsive to a filter input signal for producing a filter output signal. The filter comprises input means responsive to the filter input signal for producing an input signal, a first capacitor having a first and a second electrode, first switching means connected to the first and the second electrodes for switching the input signal to produce a switched signal at a predetermined sampling period, and first integrating means for integrating the switched signal to produce the filter output signal. According to this invention, the input means comprises voltage dividing means responsive to the filter input signal and coupled to the switching means for voltage dividing the filter input signal into a voltage divided signal to supply the first switching means with the voltage divided signal as the input signal.

BRIEF DESCRIPTION OF THE DRAWING

FIGS. 5A and 5B (when joined as shown in FIG. 5) is a block diagram of a switched capacitor filter according to a third embodiment of this invention;

DESCRIPTION OF THE PREFERRED EMBODIMENTS

Figure 1:
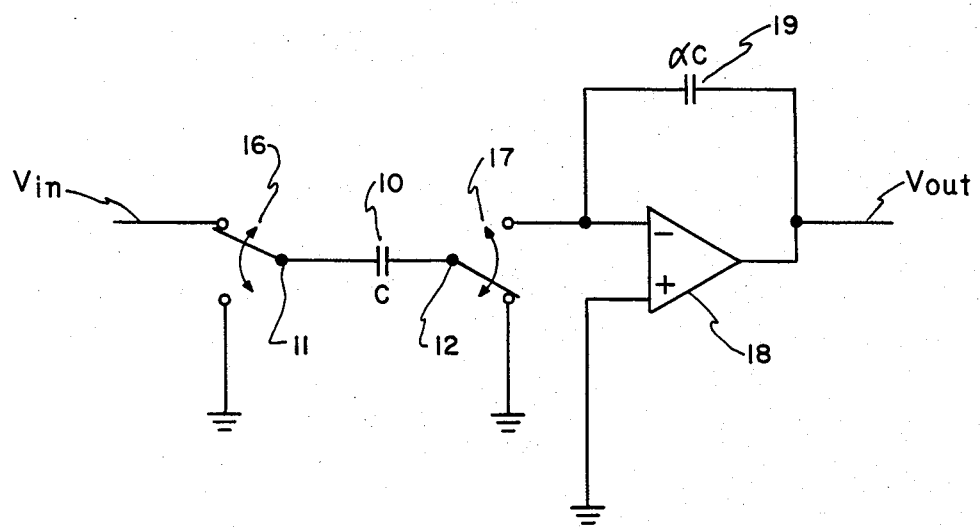
FIG. 1 is a block diagram of a conventional switched capacitor filter.

Referring to FIG. 1, a conventional switched capacitor filter of a first-order may be called an integrator and is supplied with a filter input signal $V_{in}$ to produce a filter output signal $V_{out}$. Each of the filter input signal $V_{in}$ and the filter output signal $V_{out}$ is an analog signal. The switched capacitor filter comprises a switched or a sampling capacitor 10 having first and second electrodes indicated at 11 and 12. Let the sampling capacitor 10 have a capacitance C. A switching circuit comprises a first switch 16 connected to the first electrode 11 and a second switch 17 connected to the second electrode 12. The illustrated first switch 16 is directly supplied with the filter input signal $V_{in}$ and switches the filter input signal $V_{in}$ in a first phase at a predetermined sampling rate. On the other hand, the second switch 17 produces a switched signal at the sampling rate in a second phase which is antiphase relative to the first phase.

The switched signal is supplied to an integrating circuit comprising an operational amplifier 18 and an integrating capacitor 19 inserted in a feedback path of the operational amplifier 18. Let the integrating capacitor 19 have a capacitance $\alpha C$, where $\alpha$ represents a capacitor ratio relative to a unit capacitance. Anyway, the integrating circuit produces the filter output signal $V_{out}$.

The switched capacitor filter has a transfer function which is specified by a ratio of the output signal $V_{out}$ to the input signal $V_{in}$ and which is given by:

$$V_{out}/V_{in} = 1/[\alpha z^{\frac{1}{2}}(1-z^{-1})], \tag{1}$$

where $z$ is equal to $e^{j2\pi f/f_c}$ where, in turn, $f_c$ represents a sampling or a clock frequency equal to a reciprocal of the sampling rate and $f$, a frequency of the filter input signal $V_{in}$. Thus, the transfer function (1) is specified by z-transform and determined by the capacitance ratio $\alpha$ and the sampling frequency $f_c$. In addition, a total capacitance of the illustrated switched capacitor filter is given by:

$$(C+\alpha C)/C=1+\alpha \qquad (2)$$

When the switched capacitor filter is used as a high pass filter in which the sampling frequency is high, the capacitance ratio $\alpha$ must be large. As a result, an area occupied by the integrating capacitor 19 inevitably becomes wide on large scale integration of the switched capacitor filter. Inasmuch as the integrating capacitor 19 has a large capacitance, electric power consumption of the operational amplifier 18 becomes serious.

Figure 2:
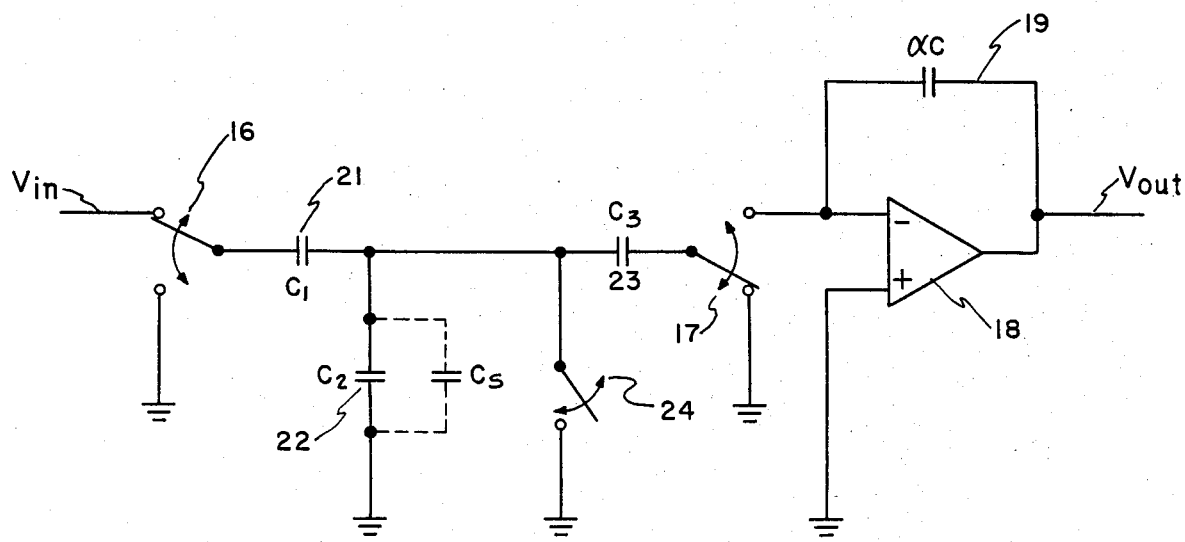
FIG. 2 is a block diagram of another conventional switched capacitor filter.

Referring to FIG. 2, another conventional switched capacitor filter is substantially equivalent to that disclosed in the Hui el at paper cited hereinabove and comprises parts designated by like reference symbols and operable with similar signals. A capacitive divider is placed between the first and the second switches 16 and 17 instead of the sampling capacitor 10 illustrated in FIG. 1. The capacitive divider comprises a first capacitor 21 having one electrode (indicated at 11) connected to the first switch 16 and an opposing electrode, a second capacitor 22 connected at one end thereof to the opposing electrode of the first capacitor 21 and grounded at the other end, and a third capacitor 23 connected in common to the first and the second capacitors 21 and 22 at one electrode of the third capacitor 23 and to the second switch 17 at the other electrode (indicated at 12). Let the first, the second, and the third capacitors 21, 22, and 23 have capacitances $C_1$, $C_2$, and $C_3$ which are equal to $k_1C$, $k_2C$, and $k_3C$, respectively, where $k_1$, $k_2$, and $k_3$ represent constants and $C$, the unit capacitance. The switched capacitor filter further comprises a third switch 24 between ground and the one electrode of the third capacitor 23.

In this structure, the first and the second capacitors 21 and 22 serve to control a total capacitance of the switched capacitor filter while the third capacitor 23 is operable as the switched or sampling capacitor, as is the case with the capacitor 10 illustrated in FIG. 1.

The illustrated switched capacitor filter has a transfer function given by:

$$V_{out}/V_{in}=(k_1 \cdot k_3)/[(k_1+k_2+k_3)\cdot(\alpha z^{\frac{1}{2}}(1-z^{-1}))] \qquad (3)$$

In order that Equation (3) becomes equivalent to Equation (1), an equation:

$$(k_1 \cdot k_3)/(k_1+k_2+k_3)=1 \qquad (4)$$

should hold. When $k_1=11$, $k_2=99$, and $k_3=11$, Equation (4) is satisfied and the respective capacitances $C_1$, $C_2$, and $C_3$ become:
$C_1=11C$,
$C_2=99C$,
and
$$C_3=11C. \qquad (5)$$

Under the circumstances, the total capacitance of the switched capacitor filter illustrated in FIG. 2 is given by:

$$(C_1+C_2+C_3+\alpha C)/11C=(121+\alpha)/11. \qquad (6)$$

Substitution of $\alpha=99$ into Formulae (2) and (6) gives values of 100 and 20, respectively. From this fact, it becomes clear that the switched capacitor filter illustrated in FIG. 2 has the total capacitance reduced to one fifth of that of the filter illustrated in FIG. 1.

With the switched capacitor filter illustrated in FIG. 2, the second capacitor 22 is inevitably accompanied by a stray capacitance (represented by $C_s$) parallel with the second capacitor 22. Accordingly, the switched capacitor filter is disadvantageous as pointed out in the preamble of the instant specification.

Figure 3:
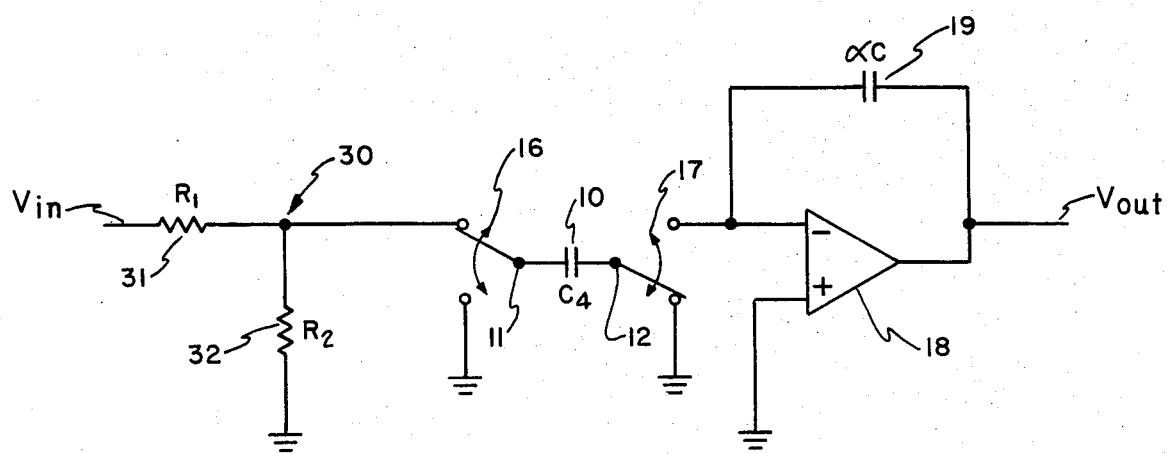
FIG. 3 is a block diagram of a switched capacitor filter according to a first embodiment of this invention.

Referring to FIG. 3, a switched capacitor filter according to a first embodiment of this invention is operable as a first-order filter and comprises similar parts designated by like reference numerals and is operable with like signals. The switched capacitor filter further comprises a voltage divider 30 responsive to the filter input signal $V_{in}$ for voltage dividing the filter input signal $V_{in}$ into a voltage divided signal to supply the voltage divided signal as an input signal to the first switch 16. The voltage divider 30 therefore serves as an input circuit for modifying the filter input singal $V_{in}$ into the input signal. More specifically, the voltage divider 30 comprises a first resistor 31 having a first resistor terminal supplied with the filter input signal $V_{in}$ and a second resistor terminal connected to the first switch 16 and a second resistor 32 having a third resistor terminal connected in common to the second resistor terminal and a fourth resistor terminal grounded. The input signal, namely, the voltage divided signal is developed across the second resistor 32. Let the first and the second resistors 31 and 32 have resistances $R_1$ and $R_2$, respectively.

The voltage divided signal is delivered to the sampling capacitor 10 through the first switch 16 in the manner described before in conjunction with FIG. 1. The capacitance of the sampling capacitor 10, however, differs from that of the sampling capacitor 10 illustrated in FIG. 1 on account of the use of the voltage divider 30 and is therefore represented by $C_4$. Let the capacitance $C_4$ be given by:

$$C_4=k_4C, \qquad (7)$$

where $k_4$ represents a constant.

Like in FIG. 1, the switched signal is supplied from the sampling capacitor 10 through the second switch 17 to the integrating circuit. The integrating circuit comprises the operational amplifier 18 and the integrating capacitor 19 of the capacitance $\alpha C$ and produces the filter output signal $V_{out}$ in an analog fashion, as is the case with that illustrated in conjunction with FIG. 1.

The switched capacitor filter illustrated in FIG. 3 has a transfer function given by:

$$V_{out}/V_{in}=(R_2k_4)/[(R_1+R_2)\alpha z^{\frac{1}{2}}(1-z^{-1})]. \qquad (8)$$

In order that Equation (8) be equivalent to Equation (1), an equation:

$$(R_2k_4)/(R_1+R_2)=1 \qquad (9)$$

should hold. At this time, the constant $k_4$ and the capacitance $C_4$ should be given by:

$$k_4=(R_1+R_2)/R_2$$

and $$C_4 = C(R_1 + R_2)/R_2, \text{ respectively.} \quad (9')$$

It is readily possible to calculate the constant $k_4$ which satisfies Equation (9). For example, when $R_1:R_2=9:1$, the constant $k_4$ becomes equal to 10. Therefore, Equation (7) is rewritten into:

$$C_4 = 10C. \quad (10)$$

Under the circumstances, a total capacitance of the switched capacitor filter is given by:

$$(10C + \alpha C)/(10C) = (10 + \alpha)/10. \quad (11)$$

When $\alpha = 99$ is substituted into Formula (11) as are the cases with Formulae (2) and (6), Formula (11) nearly becomes equal to 11. Thus, the total capacitance of the switched capacitor filter illustrated in FIG. 3 can be reduced to one ninth of that of the filter illustrated in FIG. 1.

From this fact, it is readily understood that a reduction is possible not only in an area occupied by the sampling and the integrating capacitors 10 and 19 on large scale integration but also in electric power consumption.

Figure 4:
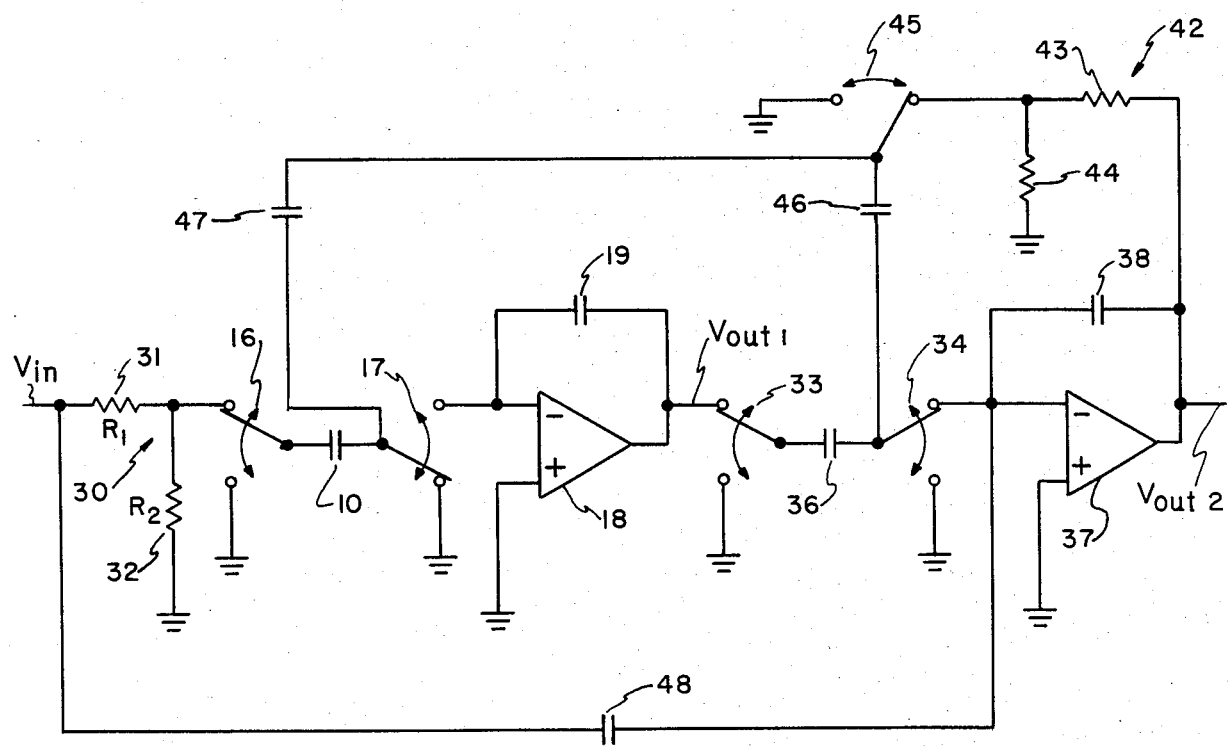
FIG. 4 is a block diagram of a switched capacitor filter according to a second embodiment of this invention.

Referring to FIG. 4, a switched capacitor filter according to a second embodiment of this invention serves as a second-order high pass filter. The switched capacitor filter comprises similar parts designated by like reference numerals and is operable with similar signals. For convenience of description, the filter output signal $V_{out}$ illustrated in FIG. 3 will be referred to as a first filter signal and will be indicated by $V_{out1}$. In addition, the voltage divider 30, the sampling capacitor 10, the switching circuit 14, and the integrating circuit will be called a first voltage divider, a first capacitor, a first switching circuit, and a first integrating circuit, respectively.

In FIG. 4, the switched capacitor filter further comprises third and fourth switches 33 and 34 which may be called a second switching circuit for cooperating with a second capacitor 36 placed between the third and the fourth switches 33 and 34. More particularly, the second capacitor 36 has a first additional electrode connected to the third switch 33 and a second additional electrode connected to the fourth switch 34. The third switch 33 is connected to the first integrating circuit to switch the first filter signal $V_{out1}$ in the first phase at the sampling rate. The fourth switch 34 is also operable at the sampling rate so as to supply a second or an additional switched signal to a second integrating circuit in the first phase. The second integrating circuit comprises an operational amplifier 37 and an integrating capacitor 38 inserted in a feedback path for the operational amplifier 37, as is the case with the first integrating circuit. In any event, the second switched signal is integrated by the second integrating circuit to be produced as a second filter signal $V_{out2}$.

The second filter signal $V_{out2}$ is delivered to an external utilization circuit (not shown) and also to a second voltage divider 42. The second voltage divider 42 comprises a third resistor 43 having one electrode connected to an output terminal of the second integrating circuit and an opposing electrode and a fourth resistor 44 connected between ground and the opposing electrode of the third resistor 43.

The third and the fourth resistors 43 and 44 are substantially equivalent to the first and the second resistors 31 and 32, respectively. A point of connection between the third and the fourth resistors 43 and 44 is connected to a fifth or auxiliary switch 45 operable in the first phase at the sampling rate. As a result, the second filter signal $V_{out2}$ is voltage divided by the second voltage divider 42 into a second or an additional voltage divided signal to be supplied to the fifth switch 45.

The fifth switch 45 switches the second voltage divided signal in the first phase at the sampling rate to produce a third or an auxiliary switched signal in the first phase.

A third or an auxiliary capacitor 46 is connected between the fifth and the fourth switches 45 and 34 so as to transmit the third switched signal from the fifth switch 45 to the fourth switch 34.

A fourth or subsidiary capacitor 47 is connected between the fifth and the second switches 45 and 17. Thus, feedback paths between the second integrating circuit and the fourth switch 34 and between the second switching circuit and the second switch 17 are operable to determine a frequency characteristic of the switched capacitor filter illustrated in FIG. 4.

In addition, the switched capacitor filter comprises a bypass capacitor 48 between the fourth switch 34 and the first resistor terminal of the first resistor 31 so as to feed the second switched signal back to the first resistor 31.

With this structure, the frequency characteristic is rarely subjected to influence of any stray capacitance. A total capacitance is therefore reduced in the switched capacitor filter as compared with the conventional filter illustrated in FIG. 2. Consequently, it is possible to use a small-sized semiconductor chip on large scale integration for the switched capacitor filter. Moreover, electric power consumption can be decreased in each operational amplifier because each operational amplifier drives a small capacitance, such as the integrating capacitor.

Figure 5A:
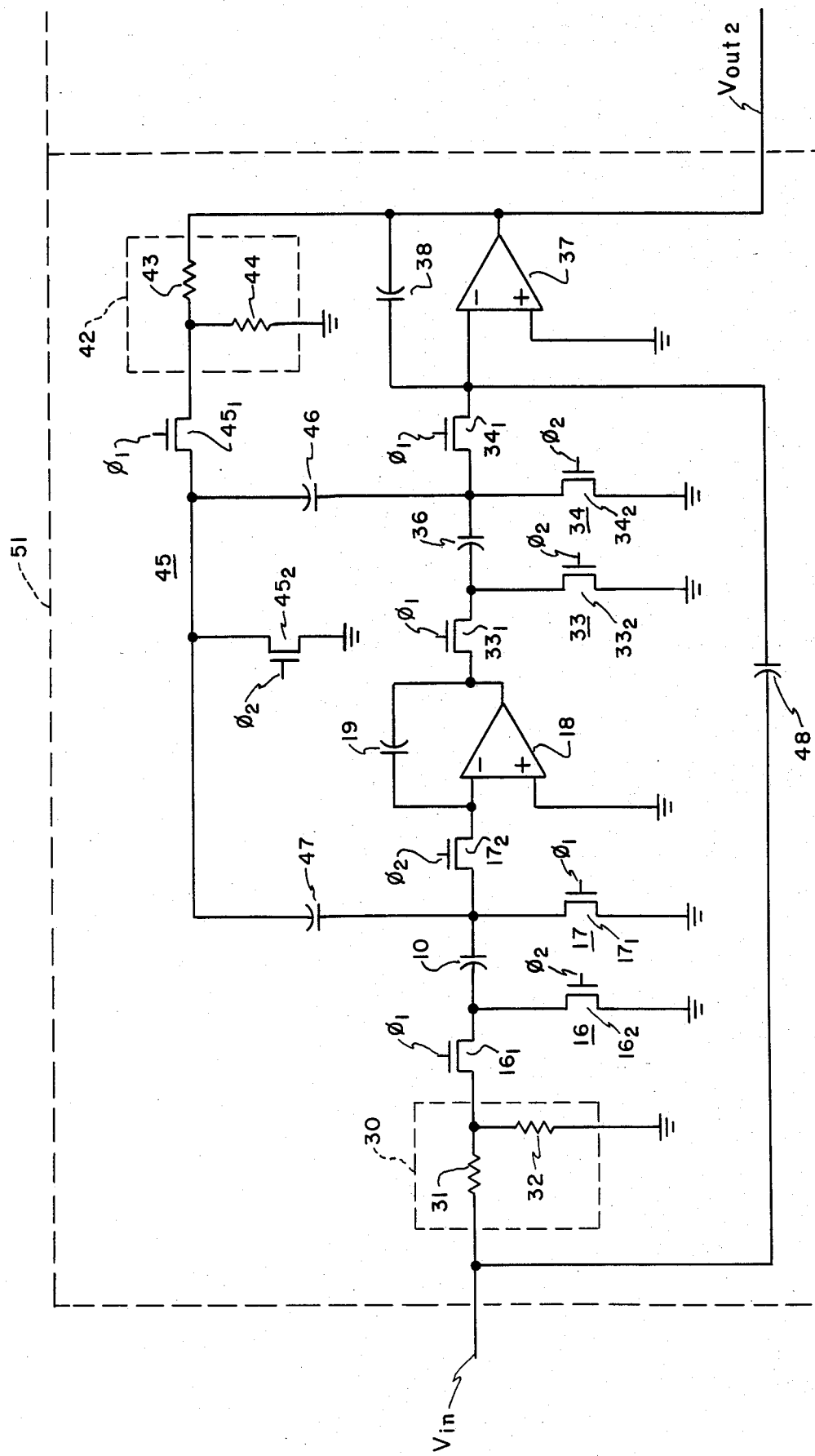

Referring to FIG. 5, a switched capacitor filter according to a third embodiment of this invention is operable as a fourth-order high pass filter. The switched capacitor filter comprises a first filter section 51 equivalent to the switched capacitor filter illustrated with reference to FIG. 4 and a second filter section 52 connected to the first filter section 51. As is the case with the switched capacitor filter illustrated in FIG. 4, the first filter section 51 comprises the first and the second voltage dividers 30 and 42 and is operable as the second-order high pass filter. The illustrated first voltage divider 30 comprises the first resistor 31 of 17.74 kiloohms and the second resistor 32 of 2.26 kiloohms while the second voltage divider 42, the third resistor 43 of 14.12 kiloohms and the fourth resistor 44 of 5.88 kiloohms.

Each of the first, the second, the third, and the fourth capacitors 10, 36, 46, and 47 illustrated in FIG. 5 has a common capacitance of 0.3 picofarad while the capacitors 19 and 38 of the first and the second integrating circuits have capacitances of 10.39 and 35.3 picofarads, respectively. In addition, the bypass capacitor 48 has a capacitance of 23.3 picofarads.

Figure 6:
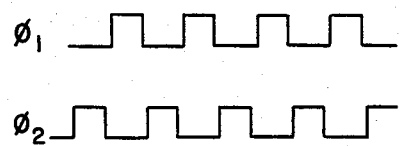
FIG. 6 shows a clock wave form chart for describing the switched capacitor filter illustrated in FIG. 5.

Referring to FIG. 6 afresh together with FIG. 5, each of the first through the fifth switches 16, 17, 33, 34, and 45 is composed of a pair of MOS (Metal-Oxide-Semiconductor) transistors. One transistor of each MOS transistor pair is driven by a succession of first clock pulses appearing at the sampling rate in the first phase, as shown by $\phi_1$, and is therefore specified in FIG. 5 by a suffix 1 added to each reference numeral for designating the first through the fifth switches. The other transistor of each MOS transistor pair is driven by a succession of second clock pulses appearing at the sampling rate in the second phase, as shown by $\phi_2$, and is therefore specified by another suffix 2. Each of the MOS transistors becomes conductive when each clock pulse takes a high level. Thus, the MOS transistors $16_1$, $17_1$, $33_1$, $34_1$, and $45_1$ are operable in antiphase relative to the other MOS transistors $16_2$, $17_2$, $33_2$, $34_2$, and $45_2$, respectively.

In the example being illustrated, each of the first and the second clock pulses $\phi_1$ and $\phi_2$ has a repetition frequency of 288 kilohertz and a duty ratio of 45%. Such clock pulses can be readily generated by the use of a well-known clock generator (not shown). In addition, the operational amplifier 18 is identical in size and characteristics with the operational amplifier 37. Such characteristics may not be different from those required for the usual switched capacitor filter.

At any rate, the first filter section 51 produces the second filter signal $V_{out2}$ in response to the filter input signal $V_{in}$ supplied to the first voltage divider 30.

In FIG. 5, the second filter section 52 is operable as a second-order high pass filter, as is the case with the first filter section 51. However, no voltage divider is used in the second filter section 52. This is because no large capacitor ratio is required in the second filter section 52, as is well known in the art.

The second filter section 52 comprises a sixth switch 56 comprising a pair of MOS transistors (shown at $56_1$ and $56_2$) which are driven by the first and the second clock pulses $\phi_1$ and $\phi_2$, respectively. The sixth switch 56 is put into operation in a manner to be described later. The sixth switch 56 is connected to a third integrating circuit comprising an operational amplifier 58 and an integrating capacitor 59 inserted in a feedback path for the operational amplifier 58.

A fifth capacitor 60 is connected between a seventh switch 62 and a eighth switch 63. Each of the seventh and the eighth switches 62 and 63 comprises an MOS transistor $62_1$ or $63_1$ operable in response to the first clock pulses $\phi_1$ and other MOS transistor $62_2$ or $63_2$ operable in response to the second clock pulses $\phi_2$.

The eighth switch 63 is connected to a fourth integrating circuit comprising an operational amplifier 64 and an integrating capacitor 65 connected in a feedback path for the operational amplifier 64. An output signal of the operational amplifier 64 is supplied as a filter output signal $V_{out}$ to an external utilization circuit (not shown) and to a ninth switch 69 comprising a pair of MOS transistors $69_1$ and $69_2$ driven by the first and the second clock pulses $\phi_1$ and $\phi_2$, respectively.

A sixth capacitor 71 and a seventh capacitor 72 are connected between the ninth switch 69 and the eighth switch 63 and between the ninth switch 69 and the sixth switch 56, respectively.

A combination of the ninth and the sixth switches 69 and 56 is similar in operation to another combination of the first and the second switches 16 and 17 while a combination of the seventh and the eighth switches 62 and 63 is similar in operation to a combination of the third and the fourth switches 33 and 34. Thus, the ninth and the sixth switches 69 and 56 may be called a third switching circuit while the seventh and the eighth switches 62 and 63, a fourth switching circuit.

The second filter section 52 filters the second filter signal $V_{out2}$ to produce the filter output signal $V_{out}$ in the manner similar to the first filter section 51 when the second filter signal $V_{out2}$ is given to the fourth integrating circuit through a capacitor 73.

Let the fifth, the sixth, and the seventh capacitors 60, 71, and 72 have capacitances of 0.3, 4.5, and 0.3 picofarads, respectively. Further, let the integrating capacitors 59 and 65 and the capacitor 73 have capacitances of 28.5, 29.7, and 44.7 picofarads, respectively. Each of the operational amplifiers 58 and 64 is identical in size and characteristics to each operational amplifier 18 or 37.

Under the circumstances, the switched capacitor filter illustrated in FIG. 5 has a total capacitance of 178.19 picofarads and a cut-off frequency equal to 0.4 kilohertz.

Figure 7:
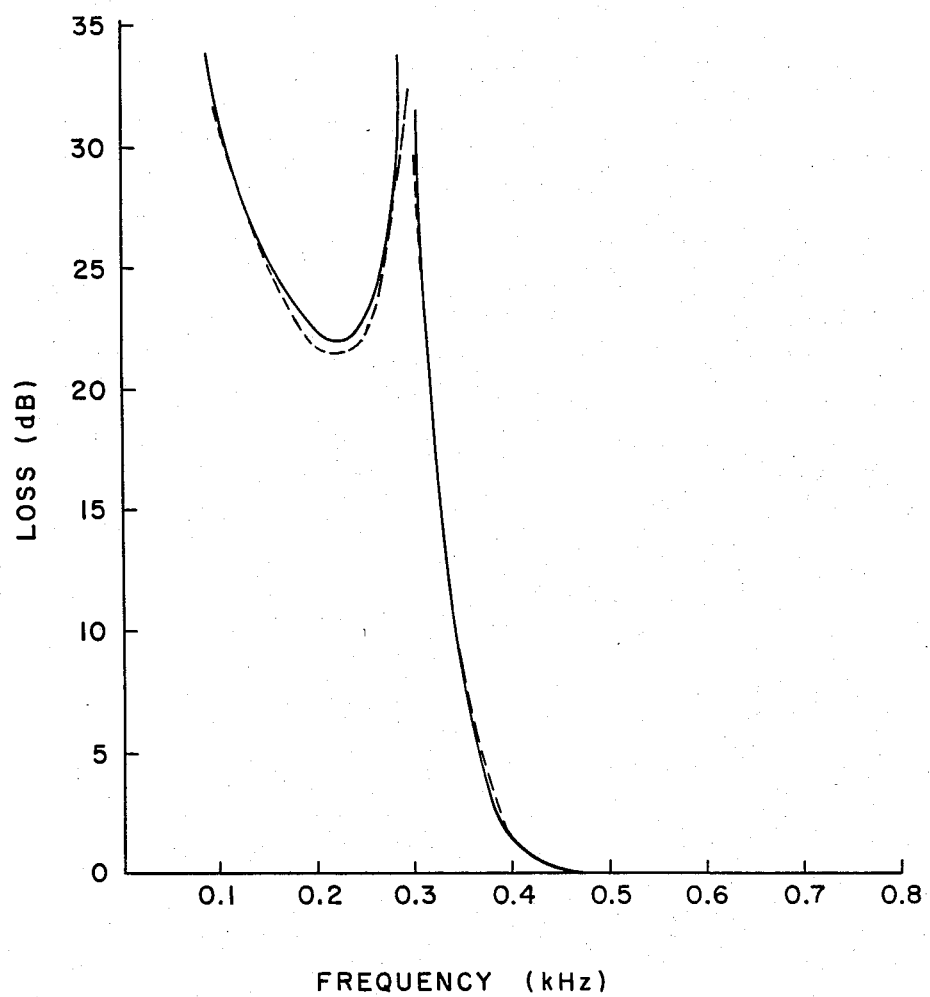
FIG. 7 is a graphical representation for describing a frequency characteristic of the switched capacitor filter.

Referring to FIG. 7, the switched capacitor filter illustrated in FIG. 5 has a frequency versus loss characteristic, as shown by a solid-line curve, when the above-mentioned circuit elements, such as the capacitors, the resistors, and the like are used in the first and the second filter sections 51 and 52. A result of simulation is also shown by a dashed-line curve. Anyway, it is readily understood that the cut-off frequency is present at 0.4 kilohertz in the switched capacitor filter illustrated in FIG. 5.

In order to clarify a merit of the switched capacitor filter illustrated in FIG. 5, attention will be directed to a conventional switched capacitor filter of the fourth-order in which the first and the second voltage dividers 30 and 42 are removed from the filter illustrated with reference to FIG. 5. For the purpose of comparison, like reference numerals will be used also for such a conventional switched capacitor filter. In order to accomplish a similar frequency versus loss characteristic illustrated in FIG. 7 by the use of the conventional switched capacitor filter, each of the first, the third, and fifth, and the seventh capacitors 10, 46, 60, and 72 must have a common capacitance of 0.3 picofarad while the second, the fourth, the sixth capacitors 36, 47, and 71 must have capacitances of 1.02, 0.78, and 4.5 picofarads, respectively. In addition, the integrating capacitors 19, 38, 59, and 65 must have capacitances of 91.8, 120, 28.5, and 29.7 picofarads, respectively, and the capacitors 48 and 73, capacitances of 79.2 and 44.7 picofarads, respectively.

As a result, a total capacitance of the conventional switched capacitor filter becomes 401.4 picofarads. Therefore, the conventional switched capacitor filter should comprise, on large scale integration, the capacitors occupying an area which is more than twice as wide an area as the capacitors used in the switched capacitor filter according to this invention.

While this invention has thus far been described in conjunction with a few embodiments thereof, it will now readily be possible for those skilled in the art to put this invention into practice in various other manners. For example, this invention is applicable to a low pass filter, a band pass filter, a band rejection filter, or the like.

What is claimed is:

1. A switched capacitor filter comprising voltage dividing means responsive to a filter input signal for producing a filter output signal $V_{out}$, said filter having a transfer function $V_{out}/V_{in}$ which is specified by a z-transform related to a unit capacitance C and which is given by:

$$V_{out}/V_{in} = 1[\alpha z^{\frac{1}{2}}(1-z^{-1})]$$

where $\alpha$ represents a capacitance ratio determined in relationship to said unit capacitance and z is equal to $e^{j2\pi f/fc}$ and where fc represents a sampling frequency and f represents a frequency of said filter input signal, said filter comprising:
- a first resistor having a first resistance of $R_1$, a first resistor terminal supplied with said filter input signal, and a second resistor terminal;
- a second resistor having a second resistance of $R_2$, a third resistor terminal connected in common to said second resistor terminal, and a fourth resistor terminal to be grounded;
- a first capacitor having a first and a second electrode and a first capacitance given by:

$$C(R_1+R_2)/R_2;$$

- first switching means connected to said first and said second electrodes for switching said input signal to produce a switched signal at a sampling frequency;
- an operational amplifier having an amplifier input signal supplied with sid switched signal and an amplifier output signal for said filter output signal; and
- an integrating capacitor connected between said amplifier input terminal and said amplifier output terminal and having a capacitance equal to C.

2. A switched capacitor filter as claimed in claim 1, said filter output signal being produced as a first filter signal, said switched capacitor filter being for producing a second filter signal in response to said first filter signal, said switched capacitor filter further comprising:

- a second capacitor having a first and a second additional terminal;
- second switching means connected to said first and said second additional electrodes for switching said first filter signal at said predetermined sampling period to produce an additional switched signal at said predetermined sampling period; and
- second integrating means for integrating said additional switched signal to produce said second filter signal.

3. A switched capacitor filter as claimed in claim 2, further comprising:

- additional voltage dividing means connected to said second integrating means for voltage dividing said second filter signal into an additional voltage divided signal;
- third switching means connected to said additional voltage dividing means for switching said additional voltage divided signal at said predetermined sampling period to produce an auxiliary switched signal; and
- a third capacitor between said third and said second switching means for transmitting said auxiliary switched signal from said third switching means to said second switching means.

4. A switched capacitor filter as claimed in claim 3, further comprising:

- a fourth capacitor between said third and said first switching means.

5. A switched capacitor filter as claimed in claim 4, further comprising:

- a bypass capacitor between said second switching means and said first resistor terminal.

* * * * *